United States Patent
Music et al.

(10) Patent No.: US 9,474,176 B2
(45) Date of Patent: Oct. 18, 2016

(54) CASE WITH PIVOTING PLATFORM

(71) Applicant: Gator Cases, Inc., Lutz, FL (US)

(72) Inventors: Kenji Music, Wesley Chapel, FL (US); Kwok Tin Cheung, Guangzhou (CN)

(73) Assignee: Gator Cases, Inc., Lutz, FL (US)

( * ) Notice: Subject to any disclaimer, the term of this patent is extended or adjusted under 35 U.S.C. 154(b) by 0 days.

(21) Appl. No.: 14/602,247

(22) Filed: Jan. 21, 2015

(65) Prior Publication Data

US 2016/0066452 A1    Mar. 3, 2016

Related U.S. Application Data

(60) Provisional application No. 62/058,065, filed on Sep. 30, 2014.

(30) Foreign Application Priority Data

Aug. 28, 2014 (CN) .................... 2014 2 0490037 U

(51) Int. Cl.
*B65D 43/24* (2006.01)
*H05K 5/02* (2006.01)
*B65D 43/16* (2006.01)

(52) U.S. Cl.
CPC ........... *H05K 5/0226* (2013.01); *B65D 43/163* (2013.01); *B65D 43/24* (2013.01); *H05K 5/023* (2013.01)

(58) Field of Classification Search
CPC .... B65D 25/04; B65D 43/163; B65D 43/24; B65D 85/38; H05K 5/0226; H05K 5/023; A45C 11/16; A01K 97/06; B25H 3/02
USPC ............. 190/16, 17, 102, 109–111; 206/305, 206/320, 372, 373, 576, 742, 743, 759, 765
See application file for complete search history.

(56) References Cited

U.S. PATENT DOCUMENTS

| 387,769 | A | | 8/1888 | Cowles | |
|---|---|---|---|---|---|
| 1,030,758 | A | * | 6/1912 | Adler | B65D 5/5266 206/742 |
| 1,099,067 | A | | 6/1914 | Lines | |
| 1,104,344 | A | | 7/1914 | Carlson | |
| 1,238,074 | A | | 8/1917 | Labadie et al. | |
| 1,272,457 | A | | 7/1918 | Kandler et al. | |
| 1,417,814 | A | * | 5/1922 | Fairweather | A47F 3/145 190/16 |
| 1,496,668 | A | | 6/1924 | Feinberg | |
| 2,281,617 | A | | 5/1942 | Ramsdell | |

(Continued)

OTHER PUBLICATIONS

U.S. Appl. No. 29/503,958, filed Sep. 30, 2014, Music.

*Primary Examiner* — Bryon Gehman
(74) *Attorney, Agent, or Firm* — Frijouf, Rust & Pyle, P.A.

(57) ABSTRACT

An improved case is disclosed with a pivoting platform. The case comprises a lower case having a primary side wall and a secondary side wall for defining a lower case chamber. Lower ends of a first arm, a second arm, a third arm and a fourth arm are pivotably coupled to the case. A platform has a primary platform side and a secondary platform side. Upper ends of the first arm, the second arm, the third arm and the fourth arm are pivotably coupled to the platform. The first arm, the second arm, the third arm and the fourth arm displace the platform between an elevated position and a non-elevated position. A primary spring is coupled to the lower end of the first arm and the upper end of the second arm for retaining the platform in the elevated position and the non-elevated position.

24 Claims, 12 Drawing Sheets

(56) References Cited

U.S. PATENT DOCUMENTS

| | | | |
|---|---|---|---|
| 2,491,374 A * | 12/1949 | Gold | B25H 3/023 |
| | | | 190/17 |
| 2,710,093 A * | 6/1955 | Raker | A01K 97/06 |
| | | | 190/17 |
| 5,437,367 A | 8/1995 | Martin | |
| 5,647,484 A * | 7/1997 | Fleming | G06F 1/1628 |
| | | | 190/109 |
| 6,129,231 A | 10/2000 | Hsiao et al. | |
| 6,173,835 B1 * | 1/2001 | Swinger | A45F 3/02 |
| | | | 190/102 |
| 6,530,475 B1 | 3/2003 | Penney | |
| 6,578,708 B2 | 6/2003 | Barnett | |
| 6,832,689 B2 | 12/2004 | Cho | |
| 7,002,793 B2 | 2/2006 | Imsand | |
| 7,278,234 B2 | 10/2007 | Marino | |
| 7,614,521 B2 | 11/2009 | Hsiao et al. | |
| 7,819,247 B2 | 10/2010 | Gonzalez | |
| 7,841,473 B2 | 11/2010 | Huang et al. | |
| 7,870,937 B1 | 1/2011 | Arnao | |
| 7,938,412 B2 | 5/2011 | Katz | |
| 2002/0063072 A1 | 5/2002 | Pham | |
| 2012/0247990 A1 | 10/2012 | Hsiao | |

\* cited by examiner

CASE WITH PIVOTING PLATFORM

CROSS-REFERENCE TO RELATED APPLICATIONS

This application claims benefit of China Application Number 201420490037.2 filed Aug. 28, 2014. All subject matter set forth in China Application Number 201420490037.2 is hereby incorporated by reference into the present application as if fully set forth herein.

This application claims benefit of U.S. Patent Provisional Application No. 62/058,065 filed Sep. 30, 2014. All subject matter set forth in U.S. Patent Provisional Application No. 62/058,065 is hereby incorporated by reference into the present application as if fully set forth herein.

BACKGROUND OF THE INVENTION

1. Field of the Invention

This invention relates to a case and more particularly to a case for transporting one or more electronic devices and supporting one or more electronic devices during use.

2. Background of the Invention

The need to transport sensitive and or delicate objects, such as instruments, devices and the like, has led to the development of an entire class of protective cases. Many of these cases are custom designed for a specific purpose or for a specific object or objects.

The structure of the case may become significant for facilitating the organization of the one or more objects within the case and for facilitating the efficient removal and installation of the one or more objects within the case, while still maintaining the protective nature of the case. The structure of the case becomes even more significant wherein the one or more objects are valuable and/or fragile. A case may further include structure for permitting access and operation of the one ore more objects while positioned within the case. The utilization of the case in the operation of objects transported therein establishes the case as part of an overall system for the transportation, protection and operation of contained objects.

Attempts have been made to develop a case that meets the above criteria and advantages. Although some level of success has been achieved in meeting some of the above criteria and advantages there continues to be a need for a more suitable case. The following U.S. patents are attempts of the prior art to solve this problem.

U.S. Pat. No. 387,769 to J. E. Cowles discloses a series of superposed boxes or trays with their corresponding sides in the same plane and each connected at its opposite ends to the next above it by a lever having its extremities pivoted to each. Two levers are pivoted to the rear ends of the lower box and the forward ends of the upper box of the series. A supporting bar is rigidly secured to and in the plane of the rear face of the upper box and extending to the bottom of the lower box, substantially as described.

U.S. Pat. No. 1,030,758 to W. S. Adler discloses a box comprising a body portion embodying a front and sides having reduced upper portions, and a bottom having its edge extended beyond the front and sides and the open back of the body portion. A lower shelf is secured within the body portion. An upper shelf is pivotally connected to the lower shelf. A body back is rigidly secured to the upper shelf and extends downwardly from, and at right-angles, thereto, and a cover is pivotally connected to the back. The back is adapted to close the open rear body portion and to rest upon the rear-wardly extended edge of the bottom, when closed, and the cover being engageable over the reduced upper portions of the front and sides of the body, whereby to lock the parts against displacement when the cover is disclosed, all for the purpose of forming a candy container which will be substantially air-tight and capable of pre-serving its contents to a necessary extent.

U.S. Pat. No. 1,099,067 to J. Lines discloses a cabinet of the class described comprising a body, a cover movably connected thereto, a plurality of separated trays each having front and rear walls. The rear wall is of considerably greater height than the front wall. Sleeves are formed at the upper edge of each rear wall. Levers are arranged at opposite sides of the trays. Pivot pins pass through the levers and the sleeves for swingingly connecting the trays to the levers. Links are pivoted to the body. Levers are pivoted to the links and also pivoted to the trays to extend parallel with the first-named levers. Chains are connected to the cover and connected to the first-named levers intermediate the ends thereof. A bearing strip is mounted on the bottom of the body and engageable by the lowermost tray for supporting the same on the raising of the trays in stepped relation to each other when the cover has been lifted.

U.S. Pat. No. 1,104,344 to W. C. Carlson discloses a confectionery box, comprising the combination of a base compartment having extended side and bottom walls, a pair of superposed compartments having a combined bottom area equal to that of the base and normally covering the base with their inner walls in approximate contact, a pair of links on two sides of each upper compartment, pivoted thereto and also pivoted to the base at points intermediate of the ends of the base and below the connections with the upper compartment. The links are of such length as to permit an extension of each of the upper compartments to a position with the inner marginal portion of its bottom supported upon the upper margin of the lower compartment, and lapping over and partially covering the lower compartment, flanges depending form the outer wall of each upper compartment normally received between the end margins of the side walls of the base and adapted to cooperate with the base in supporting the upper compartments in extended position. A cover is adapted to inclose all the compartments when the latter are in folded position and to rest upon the extended bottom wall of the base.

U.S. Pat. No. 1,238,074 to H. H. Labadie et al. discloses a luncheon or similar carrying case, comprising, in combination, a back or main portion, and a front portion. The front portion is hingedly connected to the main portion. The line of jointure of the two portions of the carrying case are a diagonal one at the ends of the two portions. The front portion has a member overlaying, and forms an extension of the back wall of the back portion. Spacers are located in the main portion. Upright walls are in the main portion adjacent the spacers. Trays are in the main portion. Links are constructed to connect the trays to each other. The lowermost of the trays are connected to the upstanding walls. The upright walls are constructed to support the lowermost tray when the trays are in superposed condition. The front portion is constructed to support the trays when in extended position remote from the point of connection of the lowermost tray with the upstanding walls. Reinforcing members are on the front portion of the carrying case are he reinforcing members are constructed to support the front portion of the carrying case free from a surface on which the carrying case may be placed when in opened condition.

U.S. Pat. No. 1,272,457 to E. Kandler et al. discloses a combination with two relatively hinged members and a tray having a tilting movement relatively to one of them of a link connecting the other member and the tray secured to one of the parts by a fixed pivot and to the other by a sliding pivot. Means for locking the link against pivotable movement arranged for cooperation with the link by a sliding movement of the latter as the hinged members are moved relatively.

U.S. Pat. No. 1,496,668 to M. Feinberg discloses a cabinet comprising a pair of open topped castings, a pivotal and sliding hinged connection between the casting at one edge thereof, whereby the castings may be disposed with their open tops together to form an enclosure or arranged horizontally with the open tops exposed, and brace members permanently pivotally mounted upon one casing and adjustably connected with the other whereby to hold one casing in stepped relation to the other.

U.S. Pat. No. 2,281,617 to B. F. Ramsdell discloses a chest for cigarettes or the like comprising, in combination, a series of flat trays arranged in face-to-face relation, each of the trays having a plurality of parallel recesses therein open at one edge of the tray to receive cigarettes or the like. Means for guiding and confining the trays for rectilinear movement with respect to each other in a direction paralleling the recesses from a position of registering relation in which each tray covers the recessed face of the next tray in the series to one of terraced relation in which each tray is laterally offset from the next to expose positions of the recesses for the removal of the cigarettes or the like stored therein. A casing for the series of trays including a hinged casing member and means for shifting the trays from registering relation to terraced relation and vice versa in response respectively to movement of the hinged number from closed to open position and vice versa.

U.S. Pat. No. 5,437,367 to M. L. Martin discloses a carrying case for electronic components such as a lap top computer, printer, CD ROM, and the like. The case has a first shell half and a second shell half connected along a hinged edge. The first shell half has shelves and foldable from a stowed position laying parallel to the plane of the first shell to a use position in a plane perpendicular thereto. The shelves are lockable in the use position.

U.S. Pat. No. 6,129,231 to J. Hsiao et al. discloses a multiple box case for housing audio equipment in both a transport and an operating mode. An upper box has six latches extending downward to engage two continuous slider members fastened to a lower box to secure the case in the transport or closed mode. In an open or operating position, the upper box is cantilevered over the rear of the lower box and four of the six latches engage the two slider members in an operator preferred one of a plurality of continuously selectable positions. A safety stop bolt is installed in each slider member so as to preclude unstable positioning of the upper box.

U.S. Pat. No. 6,530,475 to J. J. Penney discloses a portable office including a soft-sided case with six walls. The top and second side are openable. The inside of the case includes a terminal compartment, a fixed computer support shelf and a moveable printer shelf. A remote edge of the moveable printer shelf is removeably attached to the second side. A holding assembly holds the second side in an open position. A strap assembly holds the moveable printer shelf in a position parallel to and above the fixed computer shelf when the second side is open. When the second side is closed, the strap assembly holds the moveable shelf generally parallel to the second side with a printer between the second side and the moveable shelf.

U.S. Pat. No. 6,578,708 to D. Barnett discloses a combined carrying case and workstation for computer components including a first shell having a first cavity therein. A second shell is pivotally connected to the first shell for pivoting between a closed position, where the second shell is against the first shell to enclose at least a first portion of the first cavity, and an open position where the second shell extends generally perpendicular to the closed position. There is a frame having a stand and being extensibly mounted on the first shell for extension between a retracted position for transport, where the stand is adjacent to the first shell, and an extended position for workstation use, where the first shell is spaced-apart above the stand when the stand is positioned on a flat, horizontal surface. Preferably there is a third shell pivotally connected to the first shell for pivoting between a closed position, where the third shell is against the first shell to enclose a second portion of the first cavity, and an open position, where the third shell extends generally perpendicular to the closed position of the third shell.

U.S. Pat. No. 6,832,689 to Y. Cho discloses a tool box including a base and two sets of boxes located symmetrically above the base and each set of boxes is pivotally connected to the base by a set of links. Each set of links includes a long link and two short links which are located on two sides of the long link. The long link is pivotally connected the base and the two boxes at three pivot points. One of the short links is pivotally connected between the base and the box rested on the base, and the other short link is pivotally connected between the two boxes. The two sets of boxes can be expanded outward relative to the base when either one of which is pulled outward.

U.S. Pat. No. 7,002,793 to B. Imsand discloses a portable workstation computer. The computer includes a display assembly adapted to be mounted between a frontal concave member and a rearward concave member. A keyboard, mouse, and accessories may be stored in the frontal concave member. Processing, memory, and storage components are housed in the rearward concave member. The display assembly may be interposed between the frontal concave member and the rearward concave member in a briefcase configuration, forming a casing for the computer. A dual display embodiment is also disclosed.

U.S. Pat. No. 7,278,234 to S. Marino discloses a portable multipurpose tackle box with a compartment for storing tackle, bait, and other fishing related items, and a separate cooler compartment for storing food, beverages, and bait. The top compartment can be opened to reveal several extendable tackle tray assemblies. The exterior surface of the top of the tackle box has a folding leg attached to it which can be used to support the tackle box when the tray assemblies are in an extended position. The top exterior surface also has a clip attached to it for holding a flashlight in position for the night fisherman. The handle, support leg, and clips connected to the top exterior surface pivot to a storage position which is flush with the surface to enable the top surface of the tackle box to be used comfortably as a seat. In a closed position, the tackle box defines a cavity which when combined with the fact that the tackle box is constructed of a lightweight, sturdy and waterproof material, enables the tackle box to maintain a buoyant effect if placed in water. The exterior surface of the bottom of the tackle box has rubber skid strips attached thereto to prevent the tackle box from moving either when sat upon or when being used as a typical tackle box.

U.S. Pat. No. 7,614,521 to J. Hsiao et al. discloses a platform and multiple box case for housing electronic and acoustical equipment for stationary and transitional operations, and more particularly to offer an apparatus for safely and adjustably providing an upper platform mated to the upper and lower boxes of the multiple box case. Traditional types of cases and racks are suitable for typical audio gears in the DJ field. However, more users of such boxes are using laptop computers and other accessories. Yet, such users are discovering that traditional boxes lack the space for such devices on the typical cases that they are currently utilizing. The present invention provides a solution for the placement of additional gears in a variably slidable platform without taking any more space than in typical DJ boxes.

U.S. Pat. No. 7,819,247 to P. F. Gonzalez discloses a multifunction carrying case that is capable of carrying a laptop computer and converting into a laptop stand. The height of the laptop stand is telescoping, allowing for use in different situations. The case-stand combination comprises a housing similar to a hard-sided briefcase. The bottom compartment of the housing comprises a platform with a stand assembly beneath it. The stand assembly comprises a top base, telescoping risers and a bottom base. Until deployed, the bottom base is contiguous with the exterior surface of the bottom compartment. When deployed, the stand assembly is a "Z"-type shape to counterbalance the weight of the housing and a laptop computer.

U.S. Pat. No. 7,841,473 to W. Huang et al. discloses an electronic device storage/carrying case adapted for storing and supporting an electronic device, and includes a case body, a first supporting component, and a second supporting component. The case body defines a storage space for storing the electronic device, and includes a front wall formed with an opening. The first supporting component is pivoted to the case body and is pivotable upwardly relative to the case body to a propping position for supporting the electronic device, and downwardly relative to the case body to a storing position, where the first supporting component is stored in the case body. The second supporting component is connected movably to the case body and is movable between a carrying position, where the second supporting component extends outwardly of the case body via the opening in the front wall, and a supporting position, where the second supporting component is disposed in the storage space.

U.S. Pat. No. 7,870,937 to A. Arnao discloses a combination computer work station, cosmetic desk, casual/open tote and luggage set device. The device is easily transported and the area to push or pull luggage may be expanded to stow various pieces of luggage. Luggage may be partially filled yet secured by the divider device.

U.S. Pat. No. 7,938,412 to A. Katz discloses a container assembly including a base container that has an upper opening and an upper container mounted in covering relation over the upper opening of the base container. A linkage connects the upper container to the base container in a manner that allows the upper container to be displaced from the covering relation over the upper opening of the base container, so as to permit access into the base container through the upper opening. A support assembly is spaced from the base container when the upper container is displaced from the covering relation over the upper opening of the base container and wheels are disposed toward a lower portion of the container assembly. A handle is provided for rollingly transporting the container assembly on the wheels in a tilted configuration.

United States Patent Application 2002/0063072 to T. Pham discloses a computer case/table for a laptop computer. When used as a case, the compact design allows for easy and convenient transport of a laptop computer from one location to another. Upon reaching the destination, the user may readily convert the case to a computer table on which the laptop computer can be placed for use. The case includes retractable, telescopic legs and a variety of computer accessories, such as a backup battery pack, and connectors for telephone and Internet access. An internal support system allows the laptop computer to rise in a forward tilted position from a stowed position to an upward position. Upon lifting of the case lid. This allows for the comfortable use of the computer, and promotes cooling of the rear portion of the computer, where heat tends to build up, by exposure to and promotion of the circulation of cooling environmental air.

United States Patent Application 2012/0247990 to J. Hsiao discloses a disc jockey case. The device comprises an upper box and a lower box that are securely held together by means of at least one latch. At least one hinge facilitates a pivotal motion of the disc jockey case from a closed position to an open position. The lower box and the upper box securely stores at least one equipment therein and facilitates easy access to the at least one equipment. A panel of the device is incorporated with a visual display panel therein. A controller is releasably secured inside the device and is connected to the visual display panel. The visual display panel displays interactive lights such as stagnant and flashing lights in synchronization with beat/rhythm and in response to the output of the controller. The visual display panel can also be utilized as a message board for scrolling messages and advertisements.

Although the aforementioned prior art have contributed to the development of the art of cases, none of these prior art patents have solved the needs of this art.

Therefore, it is an object of the present invention to provide an improved case for transporting one or more objects.

Another object of this invention is to provide an improved case for protecting the one or more objects from damage.

Another object of this invention is to provide an improved case for permitting access and operation of the one ore more objects while positioned within the case.

Another object of this invention is to provide an improved case that is simple for the operator to use.

Another object of this invention is to provide an improved case that is cost effective to produce.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to an improved case with a pivoting platform. The case comprises a lower case having a base wall, a front wall, a rear wall, a primary side wall and a secondary side wall for defining a lower case chamber. The front wall, a rear wall, a primary wall side and a secondary wall side defines a lower case edge. A first arm extends between a lower end and an upper end. A second arm extends between a lower end and an upper end. A third arm extends between a lower end and an upper end. A fourth arm extends between a lower end and an upper end. The lower end of the first arm and the second arm are pivotably coupled to the primary side wall. The lower end of the third arm and the fourth arm are pivotably coupled to the secondary side wall. A platform has an upper surface, a lower surface, a primary platform side, a secondary platform side, a front edge and a rear edge. The upper end of the first arm and the second arm is pivotably coupled to the primary platform side. The upper end of the third arm and the fourth arm is pivotably coupled to the secondary platform side. The first arm, the second arm, the third arm and the fourth arm displaces the platform between an elevated position and a non-elevated position. A primary spring is coupled to the lower end of the first arm and the upper end of the second arm for retaining the platform in the elevated position and the non-elevated position.

In a more specific embodiment of the invention, a primary cylindrical tube encircles the primary spring and defines a primary support for terminating displacement and supporting the platform in the elevated position upon the primary cylindrical tube abutting the lower end the first arm and the upper end of the second arm. A secondary spring is coupled to the lower end of the third arm and the upper end of the fourth arm for retaining the platform in the elevated position and the non-elevated position. A secondary cylindrical tube encircles the secondary spring and defines a secondary support for terminating displacement and supporting the platform in the elevated position upon the secondary cylindrical tube abutting the lower end the third arm and the upper end of the fourth arm.

In another embodiment of the invention, an upper case has a base wall, a front wall, a rear wall, a primary side wall and a secondary side wall for defining an upper case chamber. The front wall, a rear wall, a primary wall side and a secondary wall side define an upper case edge. The upper case edge of the upper case is positioned adjacent to the lower case edge of the lower case for enclosing the platform in the non-elevated position. A lower case padding is positioned adjacent to the base wall of the lower case for supporting a lower object. An intermediate case padding is positioned between the lower object and the lower surface of the platform. An upper object is positioned on the upper surface of the platform. An upper case padding is positioned between the upper object and the base wall of the upper case. The base wall of the lower case and the base wall of the upper case compress the lower case padding, the intermediate case padding and the upper case padding for securing the lower object and the upper object relative to the platform with the upper case edge of the upper case positioned adjacent to the lower case edge of the lower case for enclosing the platform in the non-elevated position.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
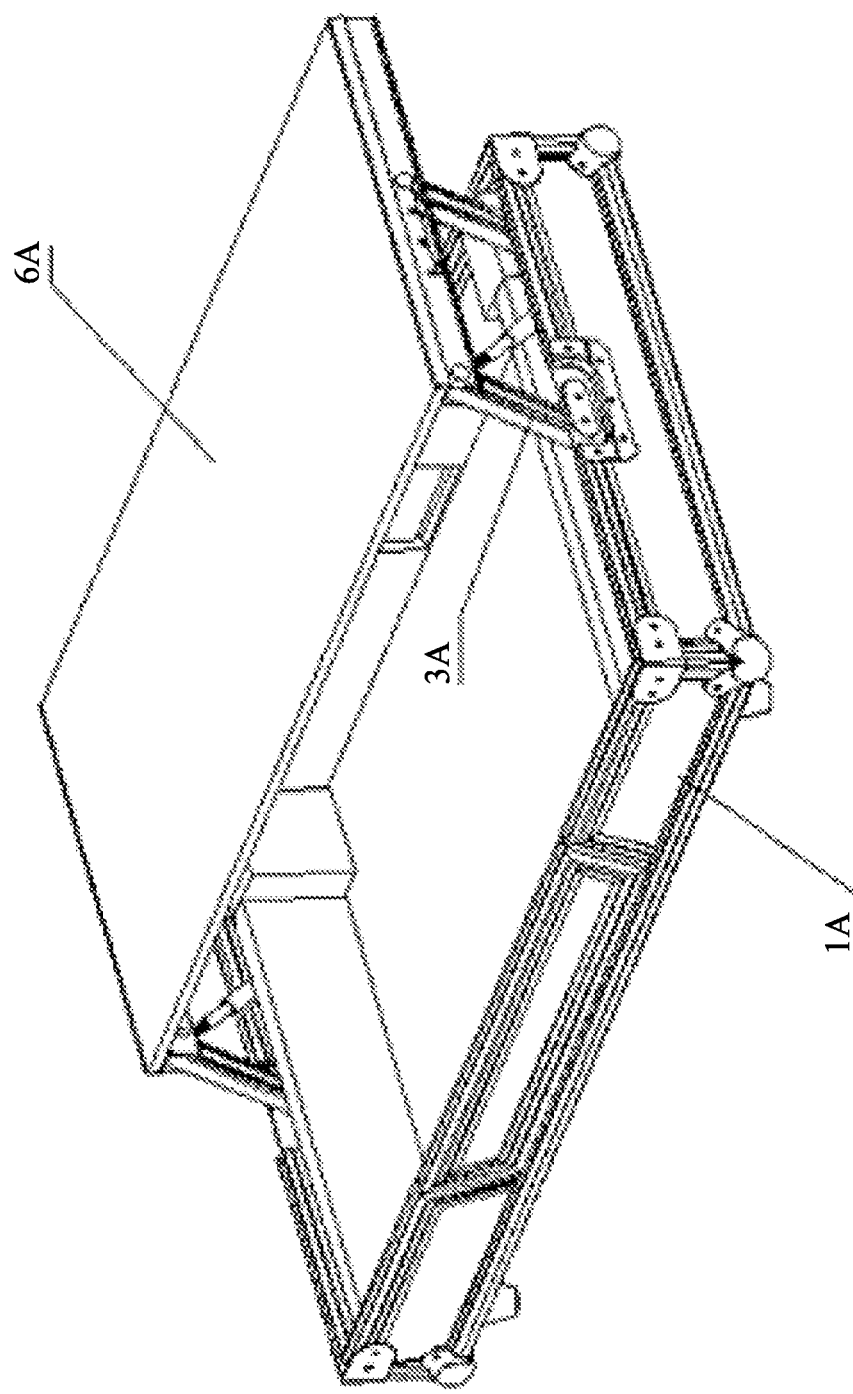
FIG. 1 is an upper front isometric view of a first embodiment for a case with a pivoting platform in an elevated position.
Figure 2:
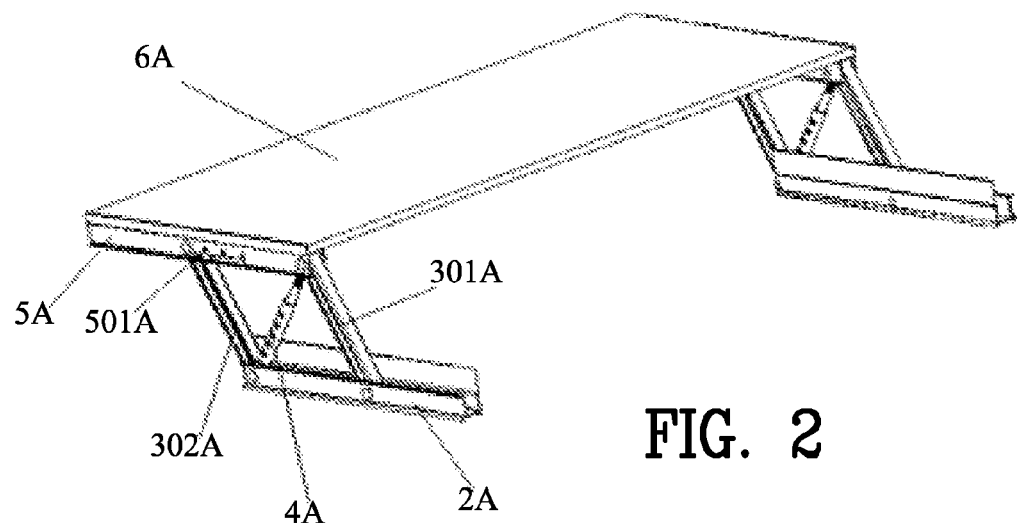
FIG. 2 is an upper front isometric view of a portion of FIG. 1 illustrating the pivoting platform and height adjustment device including a main tube and sub tube.
Figure 3:
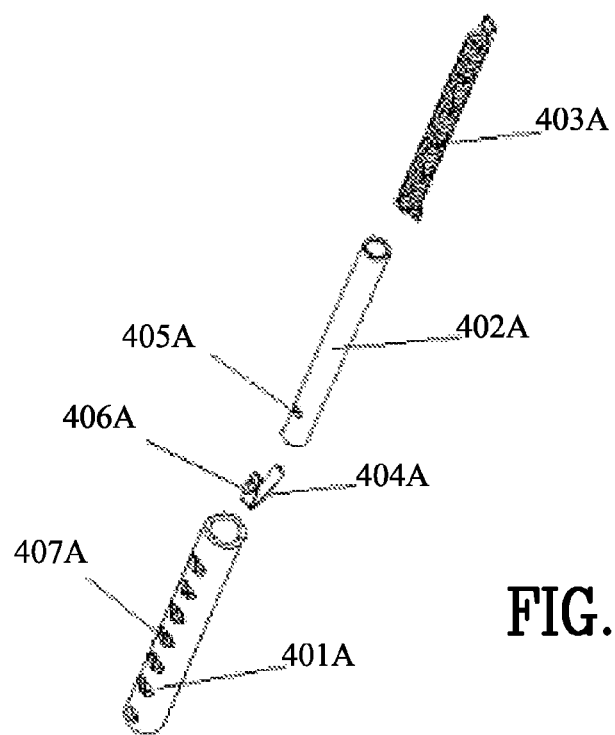
FIG. 3 is an exploded view of the main tube and sub tube with a V shape clip and stretching spring.
Figure 4:
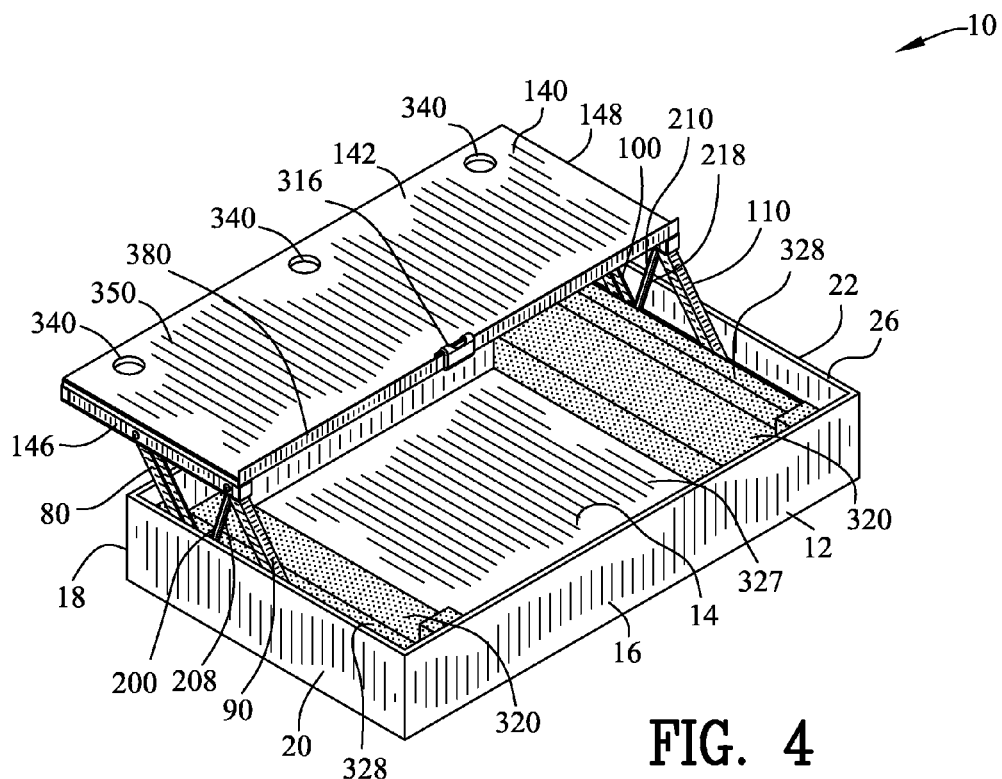
FIG. 4 is an upper front isometric view of a second embodiment for a case with a pivoting platform in an elevated position.

FIGS. 1-3 are various view of a first embodiment of a case 1A with top board 6A.

Description Summary

This Practical New Style design is case used for a sound control system, especially includes a platform that able to lift an equipment up and down. Lifting platform is installed narrow side of the case. It also includes base supporting components, side components, height secure components, platform surface secure components. All platform supports and base connections has height secure supports. This Practical New Style design will provide convenience to carrying and operating sound control system. The platform from the case can be lifted, lowered, rotated, easily to be used. Enlarge equipment keeping space, lower transportation costs and can be operated by different people.

Rights Requests

1. A lifting Platform Cases, lifting platform installed at narrow side of the case. The function is the lifting platform includes base, sides, height secure, and top platform secure supporting components. Every platform is secured by components from front and back supporting and connected to the base supporting section. There is height securing support on platform supporting connections.

2. Above #1 described Lifting Platform Cases, the feature is: the platform is also the cover of the case.

3. Above #1 and 2 described, the feature is: the described height secure include main tube and sub tubes, stretching spring, V shape clips. All sup tubes have height secure holes at the bottom. All V shape clips are installed in the sub tubes, and there is a position latch that goes through the position holes and sub tubes. All main tubes internally have position holes. All sub tubes also has position holes to support main tubes. All V shape clips can go through position holes on main tube and sub tube at the same time.

4. Above #3 described the lifting platform, the feature is: the mentioned stretching spring bottom end is connected with sub tube height position. The top of the spring is secured with surface supporting components. All height position support main tube and back side support are secured on the base components.

5. Above #4 described the feature is: all platform has at least one horizontal teach to secure back supporting and track connections.

Lifting Platform Case

Technology Area

This Practical New Style Sound System Operation Case specially allows multiple items to be used on the lifting platform.

Technology Background

General musical performances require sound control system. A nice sound control system needs sound equipment, DJ control, computer or flat computer to be used together. As China invention patent CN103377017A published sound control system, including main device, support program. Main device includes monitor, data store, function connection, sound output, operation, and other components. All these equipment need a lot space to set up. Without specialized platform, it is very difficult to operate during touring performances. Also, a set of DJ very often needs to be used in different location. It is very difficult to transport and costly.

Invention Content

The purpose of this is Practical New Style Lifting Platform Case is, allow multiple equipment in the case to be lifted and lowered.

To achieve above goal, this Practical New Style provides the case with platform that is able to be lifted and lowered. The lifting platform is installed at the narrow side of the case. On the case, the lifting platform has base supporting components, side supporting components, height positioning components, and flat top. All flat tops have supporting components. All components connected with base. At supporting components have height positioning supports that connected with the base.

For height positioning, easily to extend or suppress tubes, and secure height position, all height positioning support include positioning supporting main tubes, positioning sub tubes, stretch latch and V shape clips. All height positioning sub tubes has first positioning hole, V shape clip located in sub tube, goes through first position hole and comes out of sub tube. Sub position pipe is installed inside of main tube. The position clips can go through first and second position holes on both main tube and sub tube.

Mentioned stretching spring and positioning tubes are connected at the bottom, also connected with supporting components for the platform.

To enable the platform to be secured at different angles for different equipment, horizontal leveling teeth are used for the supporting components. A diagonal supporting bar also applied for securing moving track.

Excellency is the platform is actually the cover of the case.

This Practical New Style Lifting Platform Case has below functions

1. The Lifting Platform Case organizes the case's structure, expends the spaces. It makes carrying, transporting easier, keep equipment organized, and convenient during operations. The platform in the case can be lifting and lowered to provide convenience for users.

2. The lifting platform can be rotated and secured at different angles, it will protect users' nicks from uncomfortable positions.

3. The lifting platform can be lifted to different levels for different height of people.

Attached Drawing Explanation.

Drawing 1 is Lifter platform and the case structure

Drawing 2 Lifting platform structure

Drawing 3 shows height positioning supporting structure.

Operation Instructions

Practical Example 1 will be explained in details below.

Drawing 1 shows lifting platform inside of the case structure

Drawing 2 shows lifting platform components 2A includes base support bar 2A and diagonal supporting bar 3A, height positioning supporting bar 4A, top fixed position supporting bar 5A and top board 6A. Top fixed position supporting bar 5A installed inside of the case narrow sides, top board 6A is supported by supporting bar 5A. Supporting bar 5A and top board moving horizontally, secured and supported by diagonal supporting bar 301A and 302A, enable top board keeps horizontal position to base supporting bar 2A. Top board supporting components 5A has several position teeth 501A, and back supporting bar 302A connected with supporting bar 5A and installed inside of the sliding track.

Drawing 3 shows, height position tubes include main tubes 401A, height positioning tubes 402A, stretching spring 403A, V shape clip 404A, height position tube 402A has a position hole at the end 405A, V shape clip 404A is installed inside of sub tube, position latch 406A goes through first hole 405A and pup out of sub tube. Main tube 401A has second position holes 407A, sub tube 402A installed inside of main tube 401A. V shape clip 404A position latch 406A can go through first position hole.

When it is been used, platform can be lifted and lowered by external strength (manually pull or push) to adjust the heights, lengths and rotating angles. Diagonal supporting bar 3A and flat board 6A can be set different heights and angles. Once the height of the top board is set, it also can be adjusted to be at different angle since supporting bar 302A, 5A and parallel teeth 501A are sliding to different positions.

In this example, the platform 6A can be designed as the cover of the case. Other structures are the same.

FIGS. 4-23 are various views of a second embodiment for a case 10 with a pivoting platform 100. The case 10 comprises a lower case 12 having a base wall 14, a front wall 16, a rear wall 18, a primary side wall 20 and a secondary side wall 22 for defining a lower case chamber 24. The front wall 16, a rear wall 18, a primary wall side 20 and a secondary wall side 22 defines a lower case edge 26. The case 10 may be constructed from a metallic, polymeric or other rigid materials.

An upper case 30 having a base wall 32, a front wall 34, a rear wall 36, a primary side wall 40 and a secondary side wall 42 for defining an upper case chamber 44. The front wall 34, the rear wall 36, the primary wall side 40 and a secondary wall side 42 define an upper case edge 46. The upper case edge 46 of the upper case 30 is positioned adjacent to the lower case edge 26 of the lower case 12 for forming a sealed container 50. The upper case 30 may be constructed from a metallic, polymeric or other rigid materials.

The rear wall 18 of the lower case 12 and the rear wall 36 of the upper case 30 may include one or more case hinges 52. The case hinges 52 maintain the lower case 12 and the upper case 30 together and permit the pivoting displacement of the upper case 30 relative to the lower case 12. Alternatively, the rear wall 18 of the lower case 12 and the rear wall 36 of the upper case 30 may include one or more releaseable hinges 54. The releaseable hinges 54 permit the separation of the upper case 30 from the lower case 12 when the upper case 30 is in the open position. One or more case locks 56 engage between the front wall 16 of the lower case 12 and the front wall 34 of the upper case 30 for maintaining the lower case 12 adjacent to the upper case 30. The case 10 may further include a handle 60 for grasping the case 10. In addition, the case 10 may include one or more casters 62 for rolling the case 10 over a surface.

A first arm 80 extends between a lower end 82 and an upper end 84. A second arm 90 extends between a lower end 92 and an upper end 94. A third arm 100 extends between a lower end 102 and an upper end 104. A fourth arm 110 extends between a lower end 112 and an upper end 114. The lower end 82 of the first arm 80 and the lower end 92 of the second arm 90 are pivotably coupled to the primary side wall 20. The lower end 102 of the third arm 100 and the lower end 112 of the fourth arm 110 are pivotably coupled to the secondary side wall 22. More specifically, a pivot pin 120 may traverse the lower end 82 of the first arm 80 and the lower end 82 of the second arm 90 and into the primary side wall 20. In addition, a pivot pin 120 may traverse the lower end 102 of the third arm 100 and the lower end 112 of the fourth arm 110 and into the secondary side wall 22. The first arm 80, the second arm 90, the third arm 100 and the fourth arm 110 may be constructed from a metallic, polymeric or other rigid materials.

A platform 140 has an upper surface 142, a lower surface 144, a primary platform side 146, a secondary platform side 148, a front edge 150 and a rear edge 152. The upper end 84 of the first arm 80 and the upper end 94 of the second arm 90 are pivotably coupled to the primary platform side 146. The upper end 104 of the third arm 100 and the upper end 114 of the fourth arm 100 are pivotably coupled to the secondary platform side 148. More specifically, a pivot pin 120 may traverse the upper end 84 of the first arm 80 and the upper end 94 of the second arm 90 and into the primary platform side 146. In addition, a pivot pin 120 may traverse the upper end 104 of the third arm 100 and the upper end 114 of the fourth arm 110 and into the secondary platform wall 148.

Figure 5:
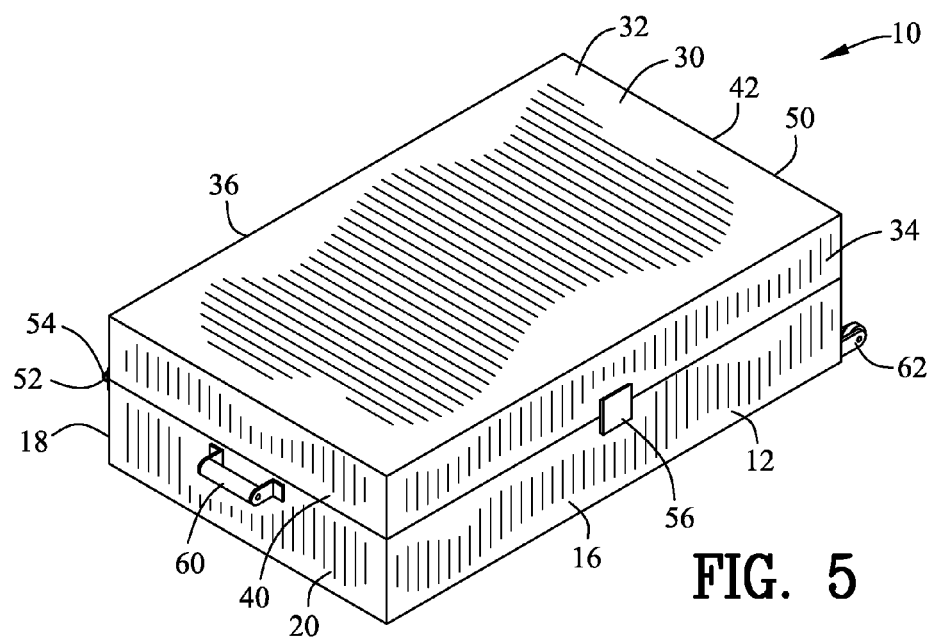
FIG. 5 is a similar view of FIG. 4 with the pivoting platform in a non-elevated position and an upper case engaging the case.
Figure 6:
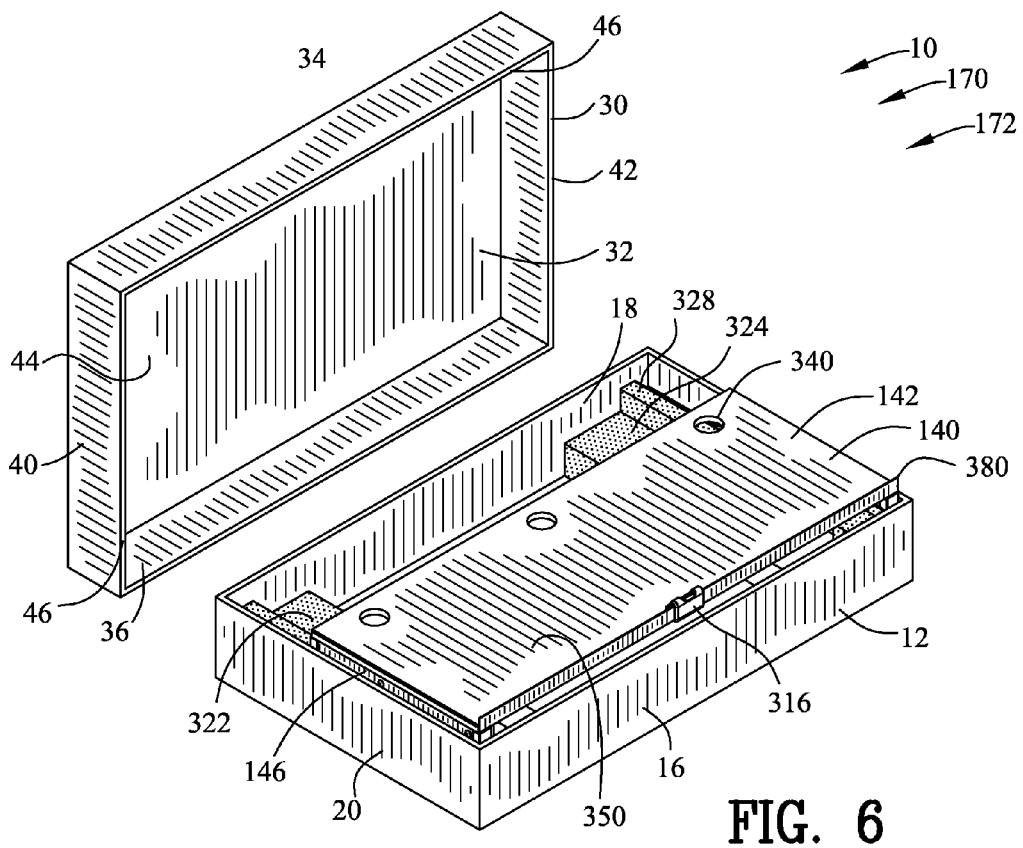
FIG. 6 is a similar view of FIG. 5 illustrating the upper case removed from the case.
Figure 7:
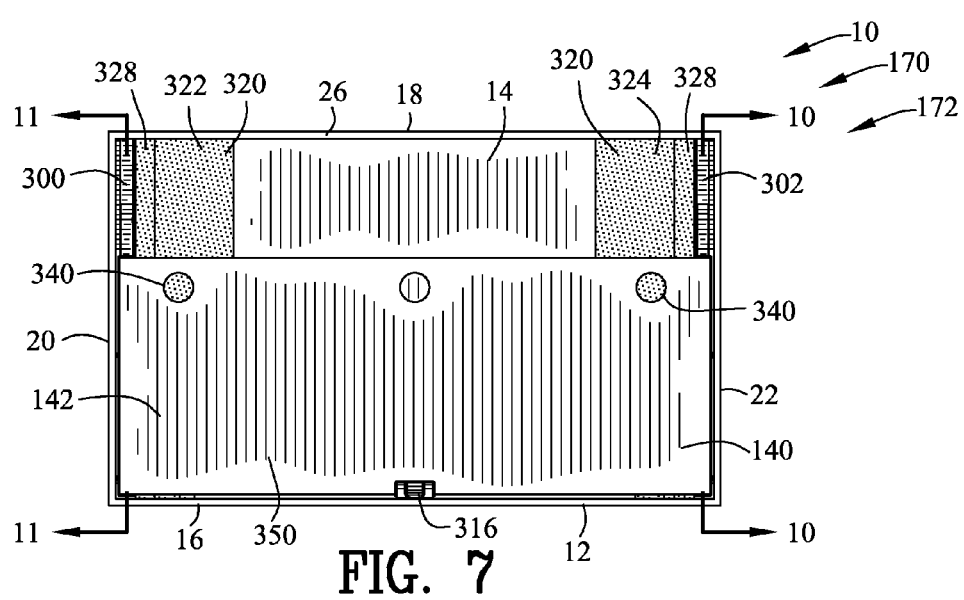
FIG. 7 is a top view of the case in FIG. 6.
Figure 8:
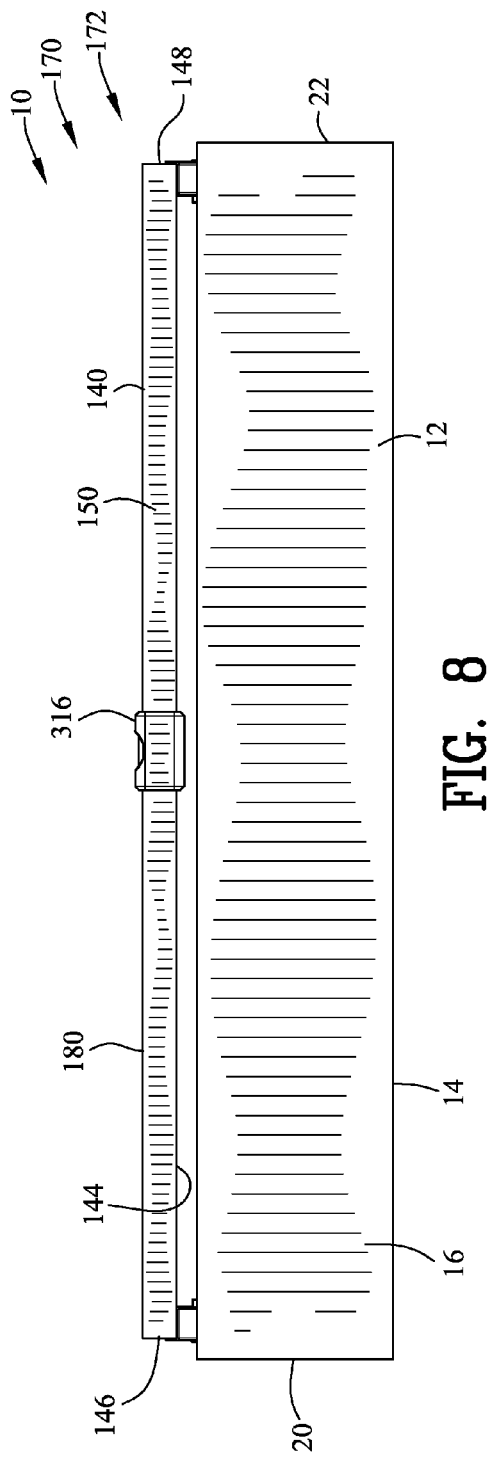
FIG. 8 is a front view of FIG. 7.
Figure 9:
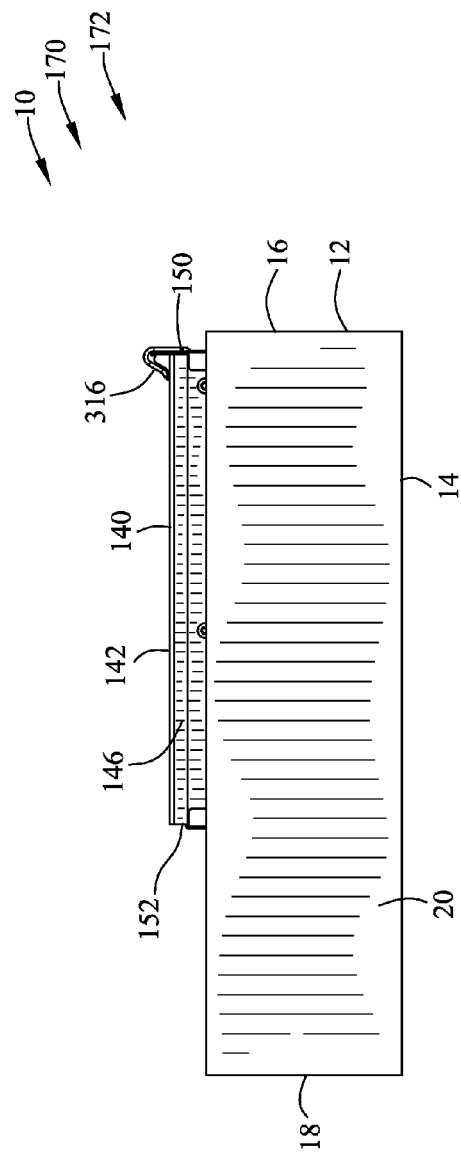
FIG. 9 is a left side view of FIG. 7.
Figure 22:
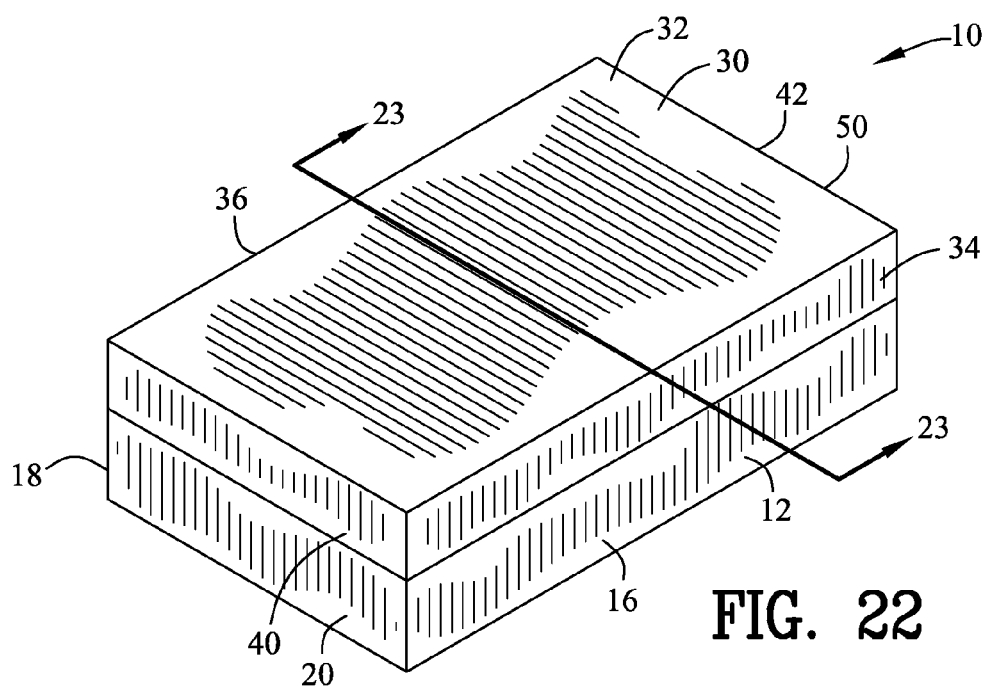
FIG. 22 is a view similar to FIG. 5 having the upper case engaging with the case and encapsulating the first electronic device and the second electronic device.
Figure 23:
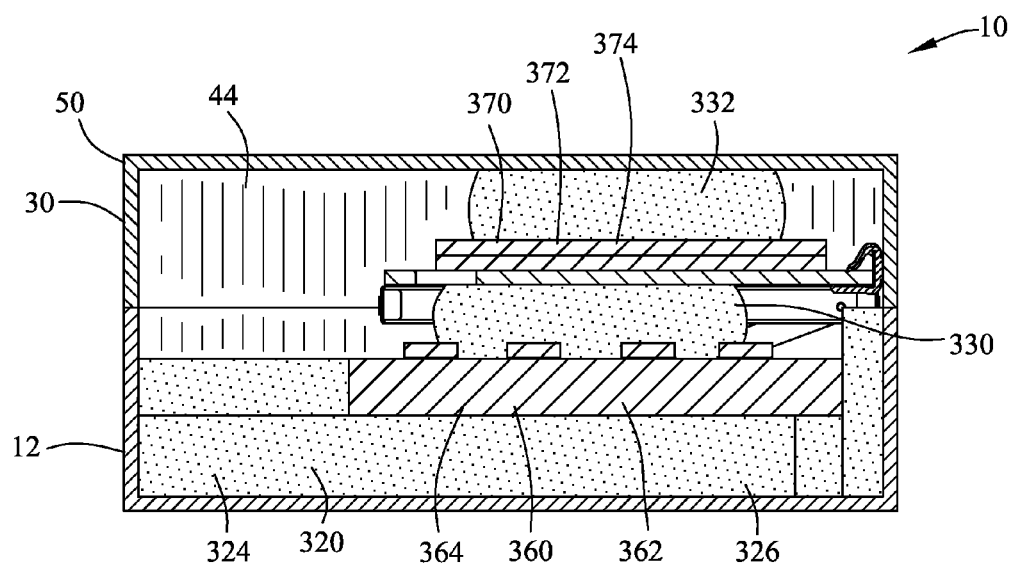
FIG. 23 is a sectional view along line 23-23 in FIG. 22.

The first arm 80, the second arm 90, the third arm 100 and the fourth arm 110 displaces the platform 140 between an elevated position 160 as shown in FIGS. 4, 12-17, 20 and 21, and a non-elevated position 162 as shown in FIGS. 6-11, 18 and 23. The elevated position 160 defines a cantilever orientation 162 wherein the rear edge 152 of the platform 140 is positioned beyond the rear wall 18 of the lower case 12. The non-elevated position 170 defines a non-cantilever orientation 172 wherein the front edge 150 of the platform 140 is positioned adjacent to the front wall 34 of the lower case 12. As shown in FIGS. 5, 22 and 23, during the platform 140 positioned in the non-elevated position 170, the upper case edge 46 of the upper case 30 may be positioned adjacent to the lower case edge 26 of the lower case 12 for enclosing the platform 140 within the case 10.

Figure 18:
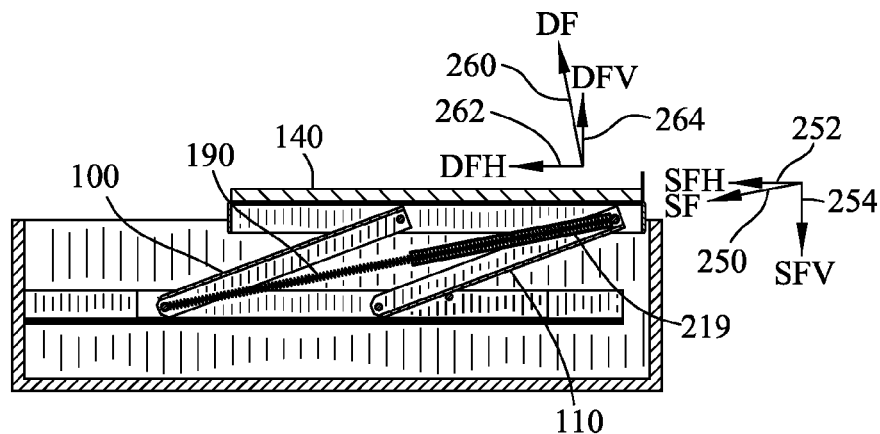
FIG. 18 is a view similar to FIG. 10 illustrating a spring applying a spring force for retaining the platform in the non-elevated position.
Figure 19:
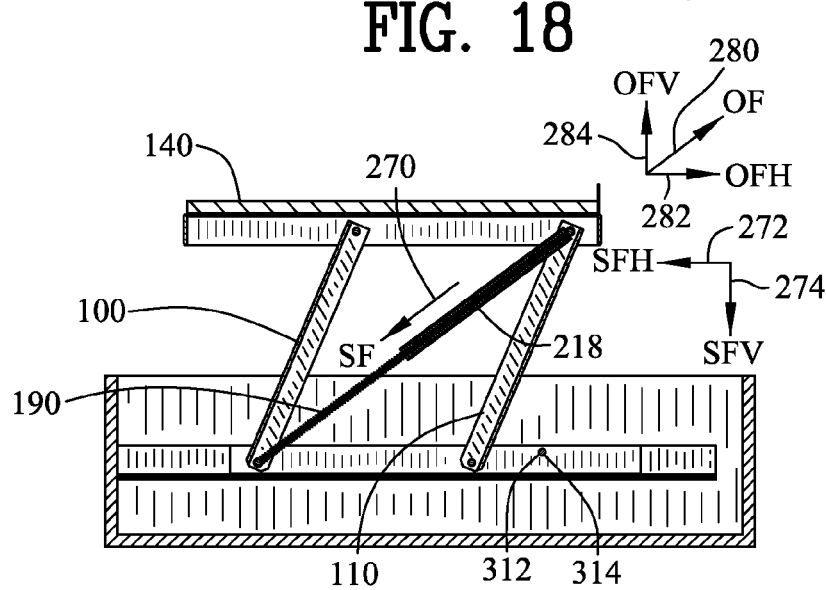
FIG. 19 is a view similar to FIG. 18 illustrating the spring applying the spring force for assisting in transitioning the platform from the non-elevated position to the elevated position.
Figure 20:
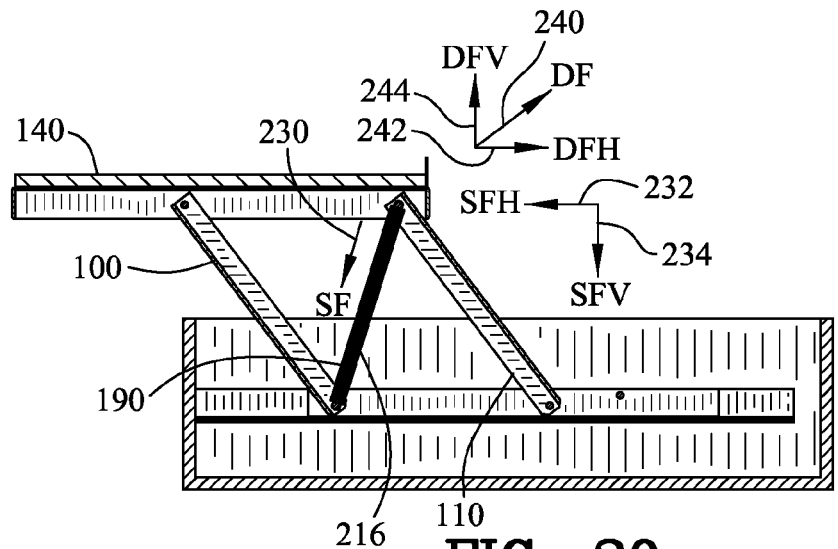
FIG. 20 is a view similar to FIG. 19 illustrating the spring applying a spring force for retaining the platform in the elevated position.

As best shown in FIGS. 18-20, the first arm 80, the second arm 90, the third arm 100 and the fourth arm 110 maintain the platform 140 in a continuous horizontal position during the displacement of a platform 140 between the elevated position 160 and the non-elevated position 162.

Figure 11:
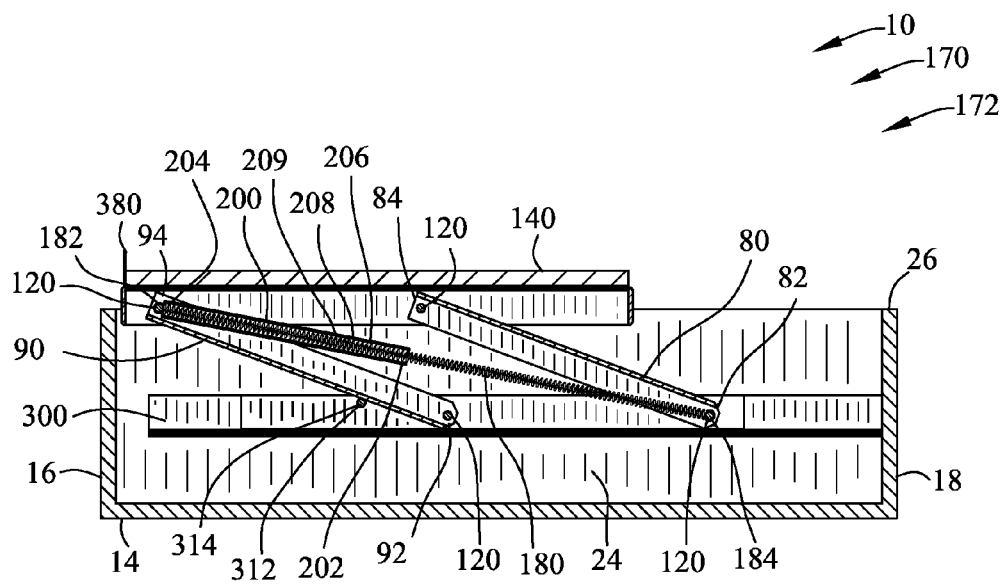
FIG. 11 is a sectional view along line 11-11 in FIG. 7.
Figure 12:
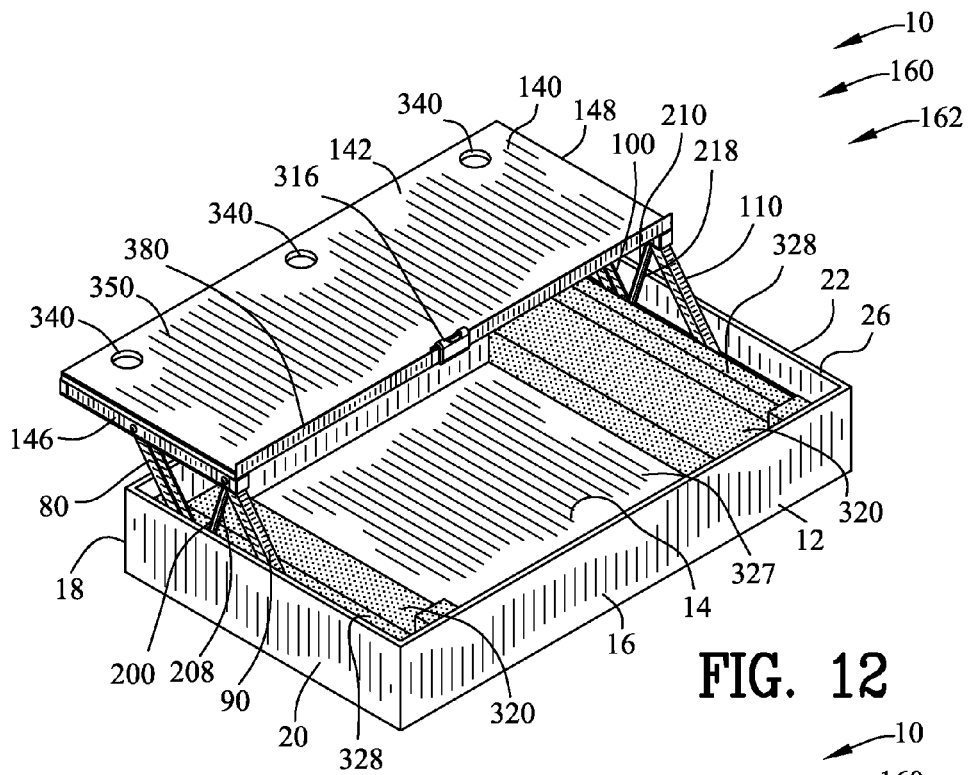
FIG. 12 is a view similar to FIG. 4.
Figure 13:
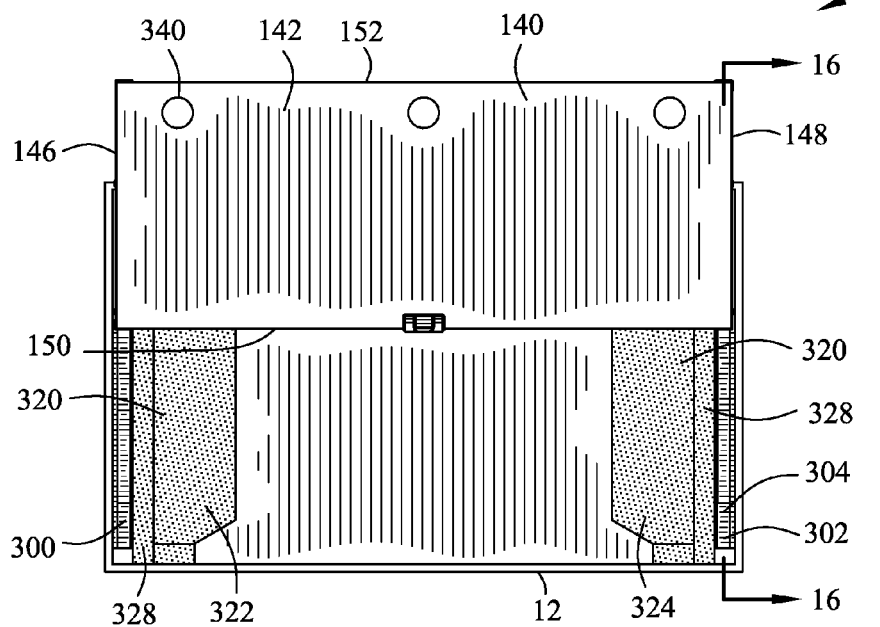
FIG. 13 is a top view of the case in FIG. 12.
Figure 14:
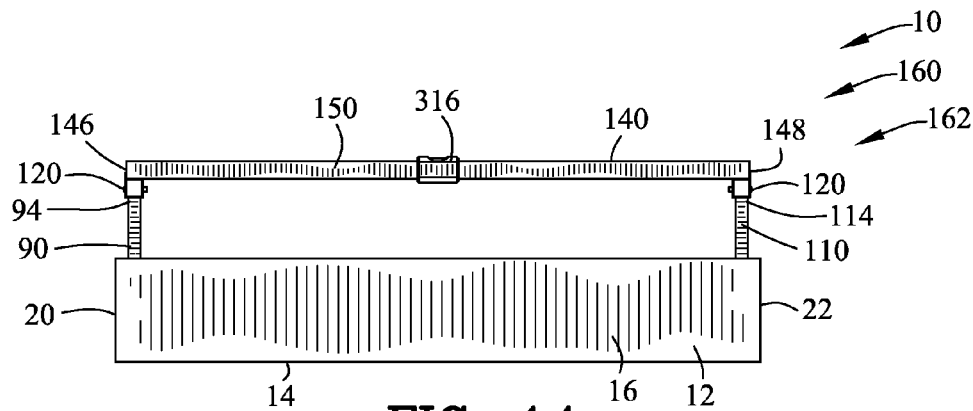
FIG. 14 is a front view of FIG. 13.
Figure 15:
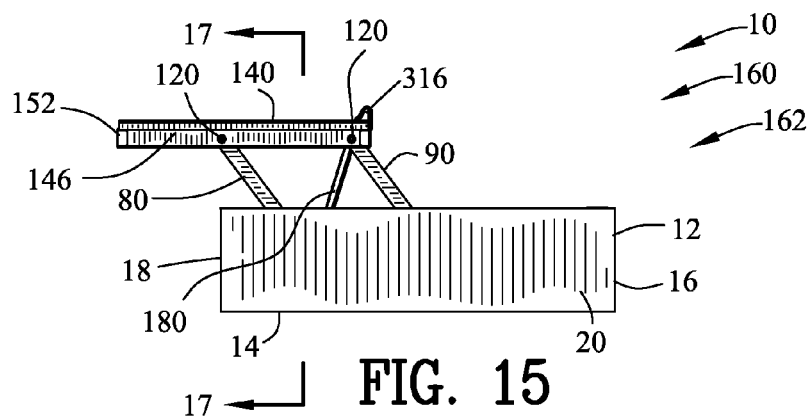
FIG. 15 is a left side view of FIG. 13.
Figure 16:
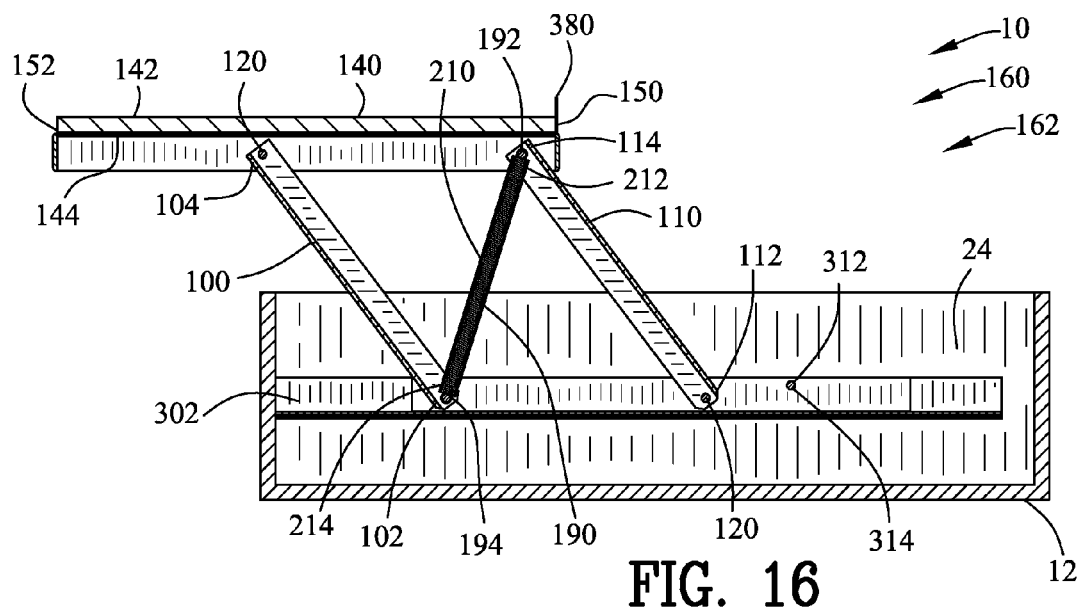
FIG. 16 is a sectional view along line 16-16 in FIG. 13.
Figure 17:
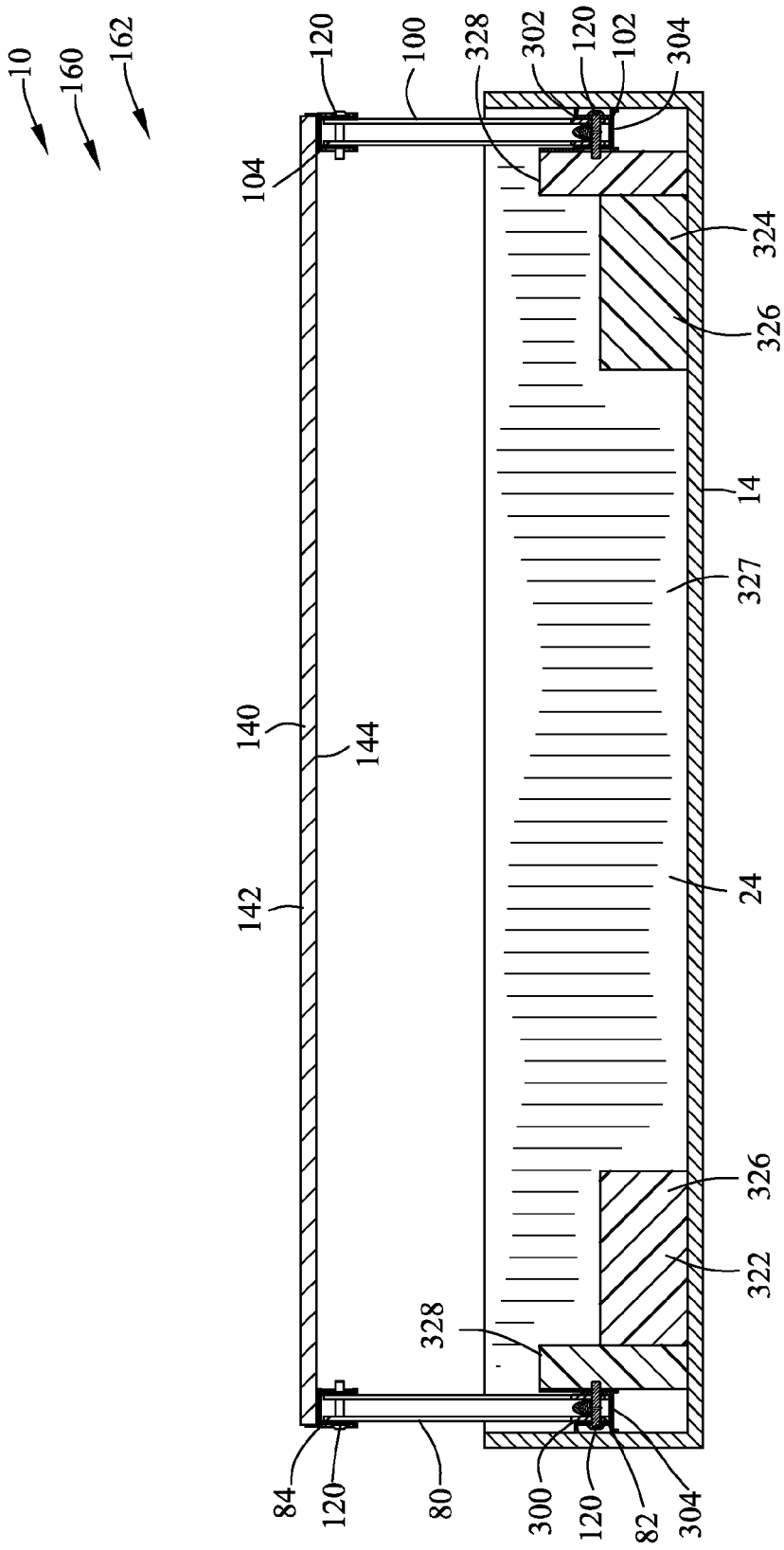
FIG. 17 is a sectional view along line 17-17 in FIG. 15.

As best shown in FIGS. 11 and 12, a primary spring 180 is coupled to the lower end 82 of the first arm 80 and the upper end 94 of the second arm 90. The primary spring 180 includes an upper hook 182 and a lower hook 184. The upper hook 182 encircles the pivot pin 120 in the upper end 94 and the lower hook 184 encircles the pivot pin 120 in the lower end 82.

Figure 10:
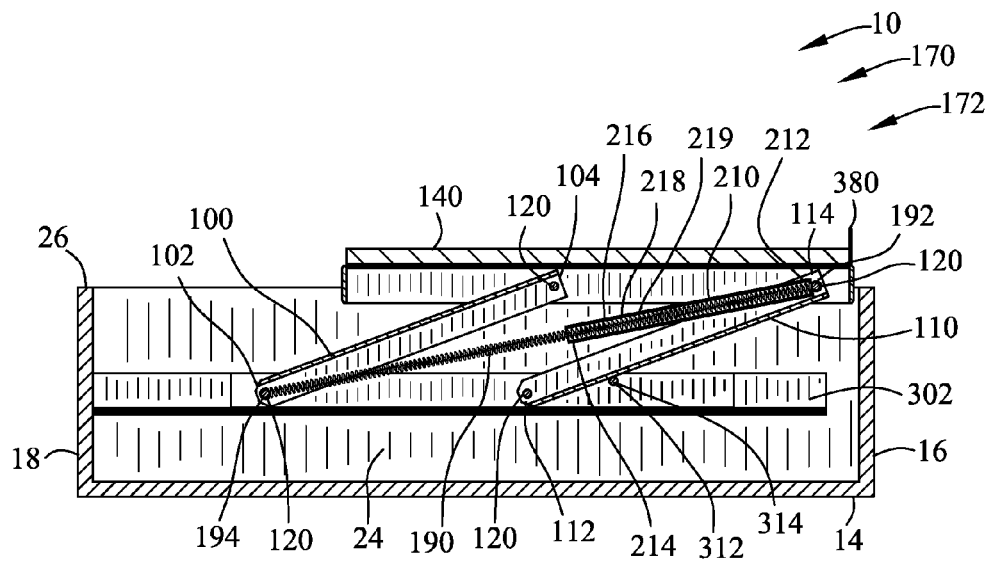
FIG. 10 is a sectional view along line 10-10 in FIG. 7.

As best shown in FIGS. 10 and 12, a secondary spring 190 is coupled to the lower end 102 of the third arm 100 and the upper end 114 of the fourth arm 110. The secondary spring 190 includes an upper hook 192 and a lower hook 194. The upper hook 192 encircles the pivot pin 120 in the upper end 114 and the lower hook 194 encircles the pivot pin 120 in the lower end 102.

The primary spring 180 and the secondary spring 190 retain the platform 140 in the elevated position 160 and the non-elevated position 170. More specifically, as shown in FIG. 18, the primary spring 180 and the secondary spring 190 apply a lower contraction force 250. The lower contraction force 250 includes a lower horizontal contraction force 252 and a lower vertical contraction force 254. The lower contraction force 250 includes a descending vector which maintains the platform 140 in the non-elevated position 170 resisting the displacement of the platform 140 from the non-elevated position 170.

A lower displacement force 260 is required to remove the platform 140 from the non-elevated position 170. More specifically, the lower displacement force 260 includes a lower horizontal displacement force 262 and a lower vertical displacement force 264. The lower displacement force 260 includes an ascending vector which overcomes the lower contraction force 250 and displaces the platform 140 from the non-elevated position 170.

As shown in FIG. 19, as the platform 140 is removed from the non-elevated position 170, the primary spring 180 and the secondary spring 190 apply an intermediate contraction force 270 for assisting in the displacement of the platform 140 from the non-elevated position 170 to the elevated position 160. The intermediate contraction force 270 includes an intermediate horizontal contraction force 272 and an intermediate vertical contraction force 274. The intermediate contraction force 270 includes a descending vector which displacing the platform 140 from the non-elevated position 170 and into the elevated position 160.

In order to prevent the platform 140 from being forcibly positioned into the elevated position 160, the user must apply an intermediate displacement force 280 on the platform 140. The intermediate displacement force 280 includes an intermediate horizontal displacement force 282 and an intermediate vertical displacement force 284. The intermediate displacement force 280 includes an ascending vector which partially opposes the intermediate contraction force 270.

As shown in FIG. 20, the primary spring 180 and the secondary spring 190 apply an upper contraction force 230 for maintaining the platform 140 in the elevated position 160 and resisting the displacement of the platform 140 from the elevated position 160. The upper contraction force 230 includes an upper horizontal contraction force 232 and an upper vertical contraction force 234. The upper contraction force 230 includes a descending vector which maintains the platform 140 in the elevated position 160 resisting the displacement of the platform 140 from the elevated position 160.

An upper displacement force 240 is required to remove the platform 140 from the elevated position 160. More specifically, the upper displacement force 240 includes an upper horizontal displacement force 242 and an upper vertical displacement force 244. The upper displacement force 240 includes an ascending vector which overcomes the upper contraction force 234 and displaces the platform 140 from the elevated position 160.

As best shown in FIGS. 4, 11, 12 and 21, a primary cylindrical tube 200 encircles the primary spring 180. The primary cylindrical tube 200 extends between an upper tube end 202 and a lower tube end 204 and defines a tube conduit 206. The primary cylindrical tube 200 defines a primary support 208 for terminating displacement and supporting the platform 140 in the elevated position 160 upon the primary cylindrical tube 200 abutting the lower end 82 the first arm 80 and the upper end 94 of the second arm 90. In addition, the primary cylindrical tube 200 defines a primary shield 209 during displacement of the platform 140 from the elevated position 160 and in the non-elevated position 170. The primary shield 209 prevents foreign objects from entangling with the primary spring 180.

As shown in FIG. 20, the primary spring 180 applies an upper contraction force 230 for maintaining engagement between the primary cylindrical tube 200 with the lower end 82 the first arm 80 and the upper end 94 of the second arm 90 and resisting the displacement of the platform 140 from the elevated position 160.

As best shown in FIGS. 4, 10, 12, 16, 20 and 21, a secondary cylindrical tube 210 encircles the secondary spring 190. The secondary cylindrical tube 210 extends between an upper tube end 212 and a lower tube end 214 and defines a tube conduit 216. The secondary cylindrical tube 210 defines a secondary support 218 for terminating displacement and supporting the platform 140 in the elevated position 160 upon the secondary cylindrical tube 210 abutting the lower end 102 of the third arm 100 and the upper end 114 of the fourth arm 110. In addition, the secondary cylindrical tube 210 defines a secondary shield 219 during displacement of the platform 140 from the elevated position 160 and in the non-elevated position 170. The secondary shield 219 prevents foreign objects from entangling with the secondary spring 190.

As shown in FIG. 20, the secondary spring 190 applies an upper secondary contraction force 230 for maintaining engagement between the secondary cylindrical tube 210 with the lower end 102 the third arm 100 and the upper end 114 of the fourth arm 110 and resisting the displacement of the platform 140 from the elevated position 160.

A primary channel 300 is coupled to the primary side wall 20 and receiving the lower end 82 of the first arm 80 and the lower end 92 of the second arm 90 for guiding the first arm 80 and the second arm 90 between the elevated position 160 and the non-elevated position 170. A secondary channel 302 is coupled to the secondary side wall 22 and receiving the lower end 102 of the third arm 100 and the lower end 112 of the fourth arm 110 for guiding the third arm 100 and the fourth arm 110 between the elevated position 160 and the non-elevated position 170. Preferably, the primary channel 300 and the secondary channel 302 define a generally U-shaped cross-section 304.

As best shown in FIG. 11, a primary stop 310 is coupled to the primary side wall 20 for terminating displacement and supporting the platform 140 in the non-elevated position 170 upon the primary stop 310 engaging with the second arm 90. As best shown in FIG. 10, a secondary stop 312 is coupled to the secondary side wall 22 for terminating displacement and supporting the platform 140 in the non-elevated position 170 upon the secondary stop 312 engaging with the fourth arm 110. Preferably, the primary stop 310 and the secondary stop 312 includes a pin 314, screw or other rigid structures.

The platform 140 may include a platform handle 316 coupled to the front edge 150 of the platform 140. The platform handle 316 assists in grasping the platform 140 and facilitating the displacement of the platform 140 between the elevated position 160 and the non-elevated position 170.

The case 10 may further include a lower case padding 320 positioned adjacent to the base wall 14 of the lower case 12. The lower case padding 320 may include a primary lower case padding 322 and a secondary lower case padding 324. The primary lower case padding 322 and the secondary lower case padding 324 are position adjacent to the primary side wall 20 and the secondary side wall 22 respectively. The lower case padding 320 defines a supporting case padding 326 for supporting a lower object 360. The primary lower case padding 322 and the secondary lower case padding 324 define a storage chamber there between and below the lower object 360. In addition or alternatively, a side case padding 328 may be positioned between the primary lower case padding 322 and the primary side wall 20 and between the secondary lower case padding 324 and the secondary side wall 22. The primary lower case padding 322 and the side case padding 328 construct a primary general L-shaped pad. The secondary lower case padding 324 and the side case padding 328 construct a secondary general L-shaped pad. The side case padding 324 distances and cushions the lower object 360 from the primary channel 300, the first arm 80, the second arm 90, the secondary channel 302, the third arm 100, and the fourth arm 110.

An intermediate case padding 330 may be positioned between the lower object 360 and the lower surface 144 of the platform 140. Preferably, the height of the lower case padding 320 and the height of the intermediate case padding 330 is such that the lower case padding 320 and the intermediate case padding 330 are compressed against the lower object 360, when the platform 140 is positioned in the non-elevated position 170. The compression of the lower case padding 320 and the intermediate case padding 330 assists in preventing displacement of the lower object 360 relative to the case 10.

An upper object 370 is positioned on the upper surface 142 of the platform 140. An upper case padding 332 may be positioned between the upper object 370 and the base wall 32 of the upper case 30. Preferably, the height of the upper case padding 332 is such that the upper case padding 332 is compressed against the base wall 32 of the upper case 30 and the upper object 370. The compression of the upper case padding 332 assists in preventing displacement of the upper object 370 relative to the case 10.

More specifically, the base wall 14 of the lower case 12 and the base wall 32 of the upper case 30 compresses the lower case padding 320, the intermediate case padding 330 and the upper case padding 332 for securing the lower object 360 and the upper object 370 relative to the platform 140 with the upper case edge 46 of the upper case 30 positioned adjacent to the lower case edge 26 of the lower case 12 for enclosing the platform 140 in the non-elevated position 170.

The platform 140 may include one or more wire apertures 340 positioned generally adjacent to the rear edge 152. The wire apertures 340 receives an electrical conduit 342 extending between the lower object 360 and the upper object 370. The wire apertures 340 serve as a wire restraint and organizer during use of the lower object 230 and the upper object 370 in the elevated position 160, during transitioning the platform 140 between the elevated position 160 and the non-elevated position 170 and during the platform 140 positioned in the non-elevated position 170.

The upper surface 142 of the platform 140 may also include a non-skid layer 350. The non-skid layer 350 may include a polymeric material for increasing the coefficient of fiction between the platform 140 and the upper object 370 and for preventing displacement of the upper object 370 relative to the platform 140. In addition, the platform 140 may further include a fence 380 coupled to the front edge 150 of the platform 140. The fence 380 assists in preventing the upper object 370 from being displaced over the front edge 150 of the platform 140.

Figure 21:
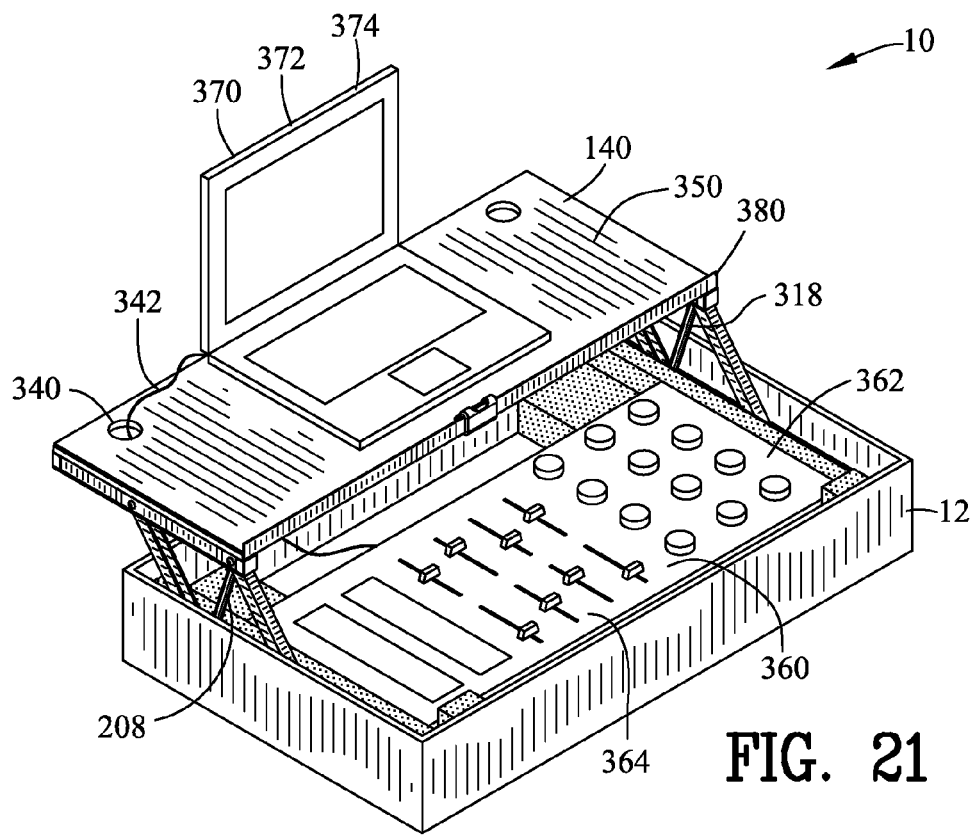
FIG. 21 is a view similar to FIG. 4 illustrating the case supporting a first electronic device and the platform supporting a second electronic device.

As shown in FIGS. 21 and 23, the case 10 may be utilized for transporting the lower object 360 and the upper object 370. The lower object 360 and upper object 370 may include a lower electrical component 362 and an upper electrical component 372 respectively. More specifically, the lower object 360 may include a DJ sound control system 364 and the upper object 370 may include a computer 374. The positioning the platform 140 into the elevated position 160 provides a convenient orientation of the computer 374 relative to the DJ sound control system 364 in order to simultaneously view and control both components 364 and 374.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A case with a pivoting platform, comprising:
a lower case having a base wall, a front wall, a rear wall, a primary side wall and a secondary side wall for defining a lower case chamber;
said front wall, said rear wall, said primary wall side and said secondary side wall defining a lower case edge;
a first arm extending between a lower end and an upper end;
a second arm extending between a lower end and an upper end;
a third arm extending between a lower end and an upper end;
a fourth arm extending between a lower end and an upper end;
said lower ends of said first arm and said second arm pivotably coupled to said primary side wall;
said lower ends of said third arm and said fourth arm pivotably coupled to said secondary side wall;
a platform having, an upper surface, a lower surface, a primary platform side, a secondary platform side, a front edge and a rear edge;
said upper ends of said first arm and said second arm pivotably coupled to said primary platform side;
said upper ends of said third arm and said fourth arm pivotably coupled to said secondary platform side;
said first aim, said second arm, said third arm and said fourth arm displacing said platform between an elevated position and a non-elevated position;
a primary spring coupled to said lower end of said first arm and said upper end of said second arm for retaining said platform in said elevated position and said non-elevated position;
a secondary spring coupled to said lower end of said third arm and said upper end of said fourth arm for retaining said platform in said elevated position and said non-elevated position;
a height position tube encircling said primary spring and said secondary spring for varying the elevation of said platform relative to said lower case and defining a support bar for supporting said platform in said elevated position;
said height position tube including a sub tube telescoping engaging within a main tube;
a clip extending between said sub tube and said main tube for locking said sub tube relative to said main tube.

2. A case with a pivoting platform as set forth in claim 1, further including a primary plurality of position teeth in said primary platform side;
a secondary plurality of position teeth in said secondary platform side;
said upper end of said first arm slidably engaging said primary plurality of position teeth for defining a primary angular adjustment;
said upper end of said third arm slidably engaging said secondary plurality of position teeth for defining a secondary angular adjustment; and
said primary angular adjustment and said secondary angular adjustment adjusting the angular position relative to said platform.

3. A case with a pivoting platform as set forth in claim 1, wherein said platform defining a cover engaging said lower case edge in said non-elevated position.

4. A case with a pivoting platform, comprising:
a lower case having a base wall, a front wall, a rear wall, a primary side wall and a secondary side wall for defining a lower case chamber;
said front wall, said rear wall, said primary wall side and said secondary side wall defining a lower case edge:
a first arm extending, between a lower end and an upper end;
a second arm extending between a lower end and an upper end;
a third arm extending between a lower end and an upper end;
a fourth arm extending between a lower end and an upper end;
said lower ends of said first arm and said second arm pivotably coupled to said primary side wall;
said lower ends of said third arm and said fourth arm pivotably coupled to said secondary side wall;
a platform having an upper surface, a lower surface, a primary platform side, a secondary platform side, a front edge and a rear edge;

said upper ends of said first arm and said second arm pivotably coupled to said primary platform side;

said upper ends of said third arm and said fourth arm pivotably coupled to said secondary platform side;

said first arm, said second arm, said third arm and said fourth arm displacing said platform between an elevated position and a non-elevated position; and a primary spring coupled to said lower end of said first arm and said upper end of said second arm for retaining said platform in said elevated position and said non-elevated position.

5. A case with a pivoting platform as set forth in claim 4, further including a primary cylindrical tube encircling said primary spring and defining a primary support for supporting said platform in said elevated position upon said primary cylindrical tube abutting said lower end said first arm and said upper end of said second arm.

6. A case with a pivoting platform as set forth in claim 5, wherein said primary spring applying an upper primary contraction force for maintaining engagement between said primary cylindrical tube with said lower end of said first arm and said upper end of said second arm and resisting the displacement of said platform from said elevated position.

7. A case with a pivoting platform as set forth in claim 4, Wherein said primary spring applying a lower primary contraction force for maintaining said platform in said non-elevated position and resisting the displacement of said platform from said non-elevated position.

8. A case with a pivoting platform as set forth in claim 4, wherein said primary spring applying an intermediate primary contraction force for assisting in the displacement of said platform from said non-elevated position to said elevated position and resisting the displacement of said platform from said elevated position to said non-elevated position.

9. A case with a pivoting platform as set forth in claim 4, further including a secondary spring coupled to said lower end of said third arm and said upper end of said fourth arm for retaining said platform in said elevated position and said non-elevated position.

10. A case with a pivoting platform as set forth in claim 9, further including a secondary cylindrical tube encircling said secondary spring and defining a secondary support for supporting said platform in said elevated position upon said secondary cylindrical tube abutting said lower end of said third arm and said upper end of said fourth arm.

11. A case with a pivoting platform as set forth in claim 10, wherein said secondary spring applying an upper secondary contraction force for maintaining engagement between said secondary cylindrical tube with said lower end of said third arm and said upper end of said fourth arm and resisting the displacement of said platform from said elevated position.

12. A case with a pivoting platform as set forth in claim 9, wherein said secondary spring applying a lower secondary contraction force for maintaining said platform in said non-elevated position and resisting the displacement of said platform from said non-elevated position.

13. A case with a pivoting platform as set forth in claim 9, wherein said secondary spring applying an intermediate secondary contraction force for assisting in the displacement of said platform from said non-elevated position to said elevated position and resisting the displacement of said platform from said elevated position to said non-elevated position.

14. A case with a pivoting platform as set forth, in claim 4, further including a primary channel coupled to said primary side wall and receiving said lower ends of said first arm and said second arm for guiding said first arm and said second arm between said elevated position and said non-elevated position; and a secondary channel coupled to said secondary side wall and receiving said lower ends of said third arm and said fourth arm for guiding said third arm and said fourth arm between said elevated position and said non-elevated position.

15. A case with a pivoting platform as set forth in claim 4, further including a primary stop coupled to said primary side wall for supporting said platform in said non-elevated position upon said primary stop engaging with said second arm; and a secondary stop coupled to said secondary side wall for supporting said platform in said non-elevated position upon said secondary stop engaging with said fourth arm.

16. A case with a pivoting platform as set forth in claim 4, further including a handle coupled to said front edge of said platform for grasping said platform and facilitating the displacement of said platform between said elevated position and said non-elevated position.

17. A case with a pivoting platform as set forth in claim 4, wherein said elevated position defines a cantilever orientation wherein said rear edge of said platform is positioned beyond said rear wall of said lower case; and said non-elevated position defines a non-cantilever orientation wherein said front edge of said platform being positioned adjacent to said front wall of said lower case.

18. A case with a pivoting platform as set forth in claim 4, further including an upper case having a base wall, a front wall, a rear wall, a primary side wall and a secondary side wall for defining an upper case chamber;

said from wall, said rear wail, said primary side wall and said secondary side wall defining an upper case edge;

said upper case edge of said upper case positioned adjacent to said lower case edge of said lower case for enclosing said platform in said non-elevated position.

19. A case with a pivoting platform as set forth in claim 18, further including a lower case padding positioned adjacent to said base wall of said lower case;

a lower object positioned on said lower case padding;

an intermediate case padding positioned between said lower object and said lower surface of said platform;

an upper object positioned on said upper surface of said platform;

an upper case padding positioned between said upper object and said base wall of said upper case; and said base wall of said lower case and said base wall of said upper case compressing said lower case padding, said intermediate case padding and said upper case padding for securing said lower object and said upper object relative to said platform with said upper case edge of said upper case positioned adjacent to said lower case edge of said lower case for enclosing said platform in said non-elevated position.

20. A case with a pivoting platform as set forth in claim 19, further including a wire aperture in said platform for receiving an electrical conduit extending between said lower object and said upper object.

21. A case with a pivoting platform as set forth in claim 19, further including a non-skid layer coupled to said upper surface of said platform for preventing displacement of said upper object relative to said platform.

22. A case with a pivoting platform as set forth in claim 19, further including a fence coupled to said front edge of said platform for preventing said upper object from being displaced over said front edge of said platform.

23. A case with a pivoting platform, comprising:
a lower case having a base wall, a front wall, a rear wall, a primary side wall and a secondary side wall for defining, a lower case chamber;
said front wall, said rear wall, said primary wall side and said secondary side wall defining a lower case edge;
a first arm extending between a lower end and an upper end;
a second arm extending between a lower end and an upper end;
a third arm extending between a lower end and an upper end;
a fourth arm extending between a lower end and an upper end;
said lower ends of said first arm and said second arm pivotably coupled to said primary side wall;
said lower ends of said third arm and said fourth arm pivotably coupled to said secondary side wall;
a platform having an upper surface, a lower surface, a primary platform side, a secondary platform side, a front edge and a rear edge;
said upper ends of said first arm and said second arm pivotably coupled to said primary platform side;
said upper ends of said third arm and said fourth arm pivotably coupled to said secondary platform side;
said first arm, said second arm, said third arm and said fourth arm displacing said platform between an elevated position and a non-elevated position;
a primary spring coupled to said lower end of said first arm and said upper end of said second arm for retaining said platform in said elevated position and said non-elevated position;
a primary cylindrical tube encircling said primary spring and defining a primary support for terminating displacement and supporting said platform in said elevated position upon said primary cylindrical tube abutting said lower end said first arm and said upper end of said second arm;
a secondary spring coupled to said lower end of said third arm and said upper end of said fourth arm for retaining said platform in said elevated position and said non-elevated position; and
a secondary cylindrical tube encircling said secondary spring and defining a secondary support for terminating displacement and supporting said platform in said elevated position upon said secondary cylindrical tube abutting said lower end said third arm and said upper end of said fourth arm.

24. A case with a pivoting platform, comprising:
a lower case having a base wall, a front wall, a rear wall, a primary side wall and a secondary side wall for defining a lower case chamber;
said front wall, said rear wall, said primary wall side and said secondary side wall defining a lower case edge;
a first arm extending between a lower end and an upper end;
a second arm extending between a lower end and an upper end;
a third arm extending between a lower end and an upper end;
a fourth arm extending between a lower end and an upper end;
said lower ends of said first arm and said second arm pivotably coupled to said primary side wall;
said lower ends of said third arm and said fourth arm pivotably coupled to said secondary side wall;
a platform having an upper surface, a lower surface, a primary platform side, a secondary platform side, a front edge and a rear edge;
said upper ends of said first arm and said second aim pivotably coupled to said primary platform side;
said upper ends of said third arm and said fourth arm pivotably coupled to said secondary platform side;
said first arm, said second arm, said third arm and said fourth arm displacing said platform between an elevated position and a non-elevated position;
a primary spring coupled to said lower end of said first arm and said upper end of said second arm for retaining said platform in said elevated position and said non-elevated position;
an upper case having a base wall, a front wall, a rear wall, a primary side wall and a secondary side wall for defining an upper case chamber;
said front wall, a rear wall, a primary wall side and a secondary wall side defining an upper case edge;
said upper case edge of said upper case positioned adjacent to said lower case edge of said lower case for enclosing said platform in said non-elevated position;
a lower case padding positioned adjacent to said base wall of said lower case;
a lower object positioned on said lower case padding;
an intermediate case padding positioned between said lower object and said lower surface of said platform;
an upper object positioned on said upper surface of said platform;
an upper case padding positioned between said upper object and said base wall of said upper case; and
said base wall of said lower case and said base wall of said upper case compressing said lower case padding, said intermediate case padding and said upper case padding for securing said lower object and said upper object relative to said platform with said upper case edge of said upper case positioned adjacent to said lower case edge of said lower ease for enclosing said platform in said non-elevated position.

* * * * *